(12) United States Patent
Lamminen et al.

(10) Patent No.: US 12,143,079 B2
(45) Date of Patent: Nov. 12, 2024

(54) POWER AMPLIFIER FOR AN ANTENNA

(71) Applicant: Teknologian tutkimuskeskus VTT Oy, Espoo (FI)

(72) Inventors: Antti Lamminen, Espoo (FI); Mikko Varonen, Espoo (FI)

(73) Assignee: Teknologian tutkimuskeskus VTT Oy, Espoo (FI)

( * ) Notice: Subject to any disclaimer, the term of this patent is extended or adjusted under 35 U.S.C. 154(b) by 192 days.

(21) Appl. No.: 17/606,777

(22) PCT Filed: Apr. 29, 2020

(86) PCT No.: PCT/FI2020/050284
§ 371 (c)(1),
(2) Date: Oct. 27, 2021

(87) PCT Pub. No.: WO2020/225476
PCT Pub. Date: Nov. 12, 2020

(65) Prior Publication Data
US 2022/0216837 A1 Jul. 7, 2022

(30) Foreign Application Priority Data
May 3, 2019 (FI) ...................................... 20195366

(51) Int. Cl.
*H04B 1/38* (2015.01)
*H03F 3/195* (2006.01)
*H03F 3/24* (2006.01)
*H03F 3/60* (2006.01)
*H04L 5/16* (2006.01)

(52) U.S. Cl.
CPC ............... *H03F 3/24* (2013.01); *H03F 3/195* (2013.01); *H03F 3/602* (2013.01)

(58) Field of Classification Search
CPC . H03F 3/24; H03F 3/195; H03F 3/602; H03F 3/45098; H03F 3/45183; H01Q 5/10; H01L 27/0605
USPC ................................. 375/219, 220, 297, 318
See application file for complete search history.

(56) References Cited

U.S. PATENT DOCUMENTS

| | | | |
|---|---|---|---|
| 5,614,863 A | 3/1997 | Pierro et al. | |
| 9,793,942 B1 | 10/2017 | Lakkis | |
| 10,879,859 B1 * | 12/2020 | Wyse | H03F 3/45098 |
| 2006/0232342 A1 | 10/2006 | Floyd et al. | |
| 2008/0297419 A1 | 12/2008 | Dou et al. | |

(Continued)

FOREIGN PATENT DOCUMENTS

| | | |
|---|---|---|
| CN | 104052416 A | 9/2014 |
| EP | 2770634 A1 | 8/2014 |

OTHER PUBLICATIONS

Hsu et al: Uniplanar Broad-Band Push—Pull FET Amplifiers. IEEE Transactions on Microwave Theory and Techniques, Dec. 1997, vol. 45, No. 12, pp. 2150-2152.

*Primary Examiner* — Phuong Phu
(74) *Attorney, Agent, or Firm* — Laine IP Oy

(57) ABSTRACT

According to an example aspect of the present invention, there is provided an apparatus for an antenna, comprising, a first power amplifier and a second power amplifier and a common ground between the first power amplifier and the second power amplifier, wherein a Radio Frequency, RF, output of the first power amplifier is coupled to the common ground and a RF output of the second power amplifier is coupled to the common ground.

15 Claims, 3 Drawing Sheets

(56) References Cited

U.S. PATENT DOCUMENTS

| | | | |
|---|---|---|---|
| 2011/0001679 A1 | 1/2011 | Meharry et al. | |
| 2012/0327624 A1* | 12/2012 | Tyhach | H01L 27/0605 |
| | | | 361/782 |
| 2017/0005412 A1 | 1/2017 | Delisio, Jr. et al. | |
| 2020/0350672 A1* | 11/2020 | Chen | H01Q 5/10 |
| 2022/0140797 A1* | 5/2022 | Oshima | H03F 3/45183 |
| | | | 330/253 |

* cited by examiner

POWER AMPLIFIER FOR AN ANTENNA

FIELD

Embodiments of the present invention relate in general to an antenna and more specifically to a power amplifier for an antenna.

BACKGROUND

In general, higher frequency bands have more bandwidth available for wireless communications and as the demand for wireless communications increases, it has become desirable to exploit millimeter-waves for such communications. Consequently, current standardization efforts in the field of wireless communications consider the use of millimeter-waves. For example, 3rd Generation Partnership Project, 3GPP, develops 5G technology, which may be referred to as New Radio, NR, radio access technology as well, and considers the use of millimeter-wave frequency bands at least for 5G/NR.

However, the use of millimeter-waves for communication also brings additional challenges because a millimeter-wave signal typically experiences higher losses compared to a lower frequency signal. There is therefore a need to provide an apparatus which efficiently amplifies a power of a signal for an antenna. Similar enhancements may also be employed in other cellular networks and in several other wireless communication networks as well, such as, for example, in Wireless Local Area Networks, WLANs.

SUMMARY OF THE INVENTION

According to some aspects, there is provided the subject-matter of the independent claims. Some embodiments are defined in the dependent claims.

According to an aspect of the present invention, there is provided an apparatus for an antenna, comprising, a first power amplifier and a second power amplifier and a common ground between the first power amplifier and the second power amplifier, wherein a Radio Frequency, RF, output of the first power amplifier is coupled to the common ground and a RF output of the second power amplifier is coupled to the common ground.

According to an aspect of the present invention, the first and the second power amplifiers may be coupled to the common ground.

According to an aspect of the present invention, the RF output of the first power amplifier may be shifted 180 degrees compared to the RF output of the second power amplifier.

According to an aspect of the present invention, return current may flow in the common ground.

According to an aspect of the present invention, the RF output of the first power amplifier and the RF output of the second power amplifier may form a balanced feed for the antenna.

According to an aspect of the present invention, the apparatus may be coupled to, or comprise, a dipole antenna.

According to an aspect of the present invention, the apparatus may be coupled to, or comprise, a patch antenna.

According to an aspect of the present invention, the apparatus may be coupled to, or comprise, a multi-layer planar antenna.

According to an aspect of the present invention, the first and the second power amplifiers may be two-way power amplifiers.

According to an aspect of the present invention, the first and the second power amplifiers may be integrated in a Monolithic Microwave Integrated Circuit, MMIC.

A wireless network node may comprise the apparatus according to any of the aspects of the present invention. Moreover, the wireless network node may be a base station configured to operate in accordance with a 3rd Generation Partnership Project, 3GPP, standard. In some embodiments, the 3GPP standard may be a 5G standard.

A wireless terminal may comprise the apparatus according to any of the aspects of the present invention as well.

EMBODIMENTS

Embodiments of the present invention relate to a power amplifier for an antenna. More specifically, embodiments of the present invention provide an efficient power amplifier which can be used to reduce losses when amplifying a Radio Frequency, RF, signal. In some embodiments, the power amplifier may comprise a first and a second power amplifier, and a common ground between the first power amplifier and the second power amplifier, thereby generating a balanced feed while enabling less loss. Thus, the common ground may be common for the first power amplifier and the second power amplifier, i.e., the first power amplifier and the second power amplifier may be coupled to the common ground.

Embodiments of the present invention may be used, e.g., for amplifying millimeter-wave signals. Demand for additional frequency spectrum is constantly increasing and hence it is desirable to use higher, millimetre-wave frequencies for wireless communications. Especially on high frequencies losses may be an issue but in general embodiments of the present invention may be used for amplifying any signal, regardless of the frequency.

Millimeter-wave frequencies are considered, e.g., in the context of 5G, i.e., New Radio, NR, networks and for future cellular networks as well. Embodiments of the invention are not limited to cellular networks though, and can be exploited in any system that uses a power amplifier. Millimetre-wave frequencies can be used for all kinds of transmissions between wireless devices, including radio access and backhaul connections.

For instance, a wireless communication network may comprise one or more wireless terminals, base stations, relay nodes and/or core network elements. A wireless terminal may be connected to a base station and/or relay node via air interface. Then, wireless communications may be performed over the air interface using a Radio Access Technology, RAT. In case of cellular networks, the RAT may be for example Long Term Evolution, LTE, New Radio, NR, or MulteFire. In case of non-cellular networks, the RAT may be for example Wireless Local Area Network, WLAN.

Using NR as an example of a cellular RAT, a base station may be referred to as gNB and a wireless terminal may be referred to as a User Equipment, UE. In case of WLAN, a base station may be referred to as an access point. Generally speaking, a base station, a relay node and an access point may be referred to as wireless network nodes. In any case, embodiments are not restricted to any particular wireless technology. Instead, embodiments may be exploited in any wireless communication network, wherein a power amplifier is used for an antenna.

Figure 1:
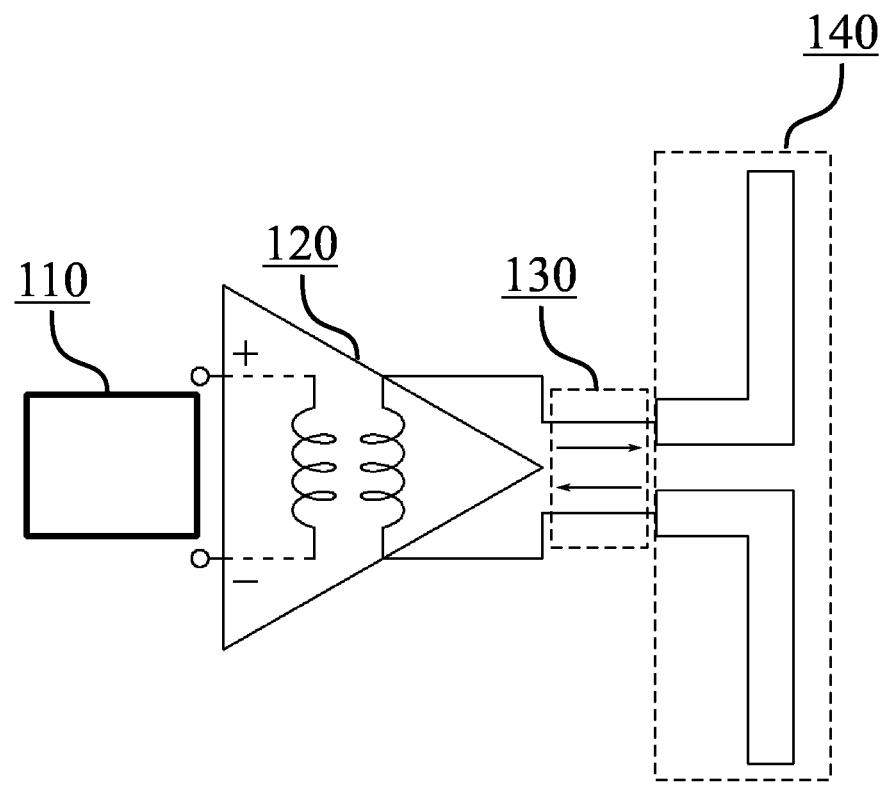
FIG. 1 illustrates a fully differential antenna in accordance with at least some embodiments of the present invention.

Concerning power amplifiers, FIG. 1 illustrates a fully differential antenna in accordance with at least some embodiments of the present invention. The fully differential antenna of FIG. 1 may comprise a RF input 110 and a power amplifier 120 coupled to the RF input 110. In FIG. 1, a fully differential current flow is denoted by 130. Moreover, the fully differential antenna of FIG. 1 may also comprise an antenna 140, such as a dipole antenna.

For instance, a fully differential power amplifier may be used for a fully differential antenna of FIG. 1. In such a case, power may be combined within the fully differential antenna. Thus, on-chip, or Printed Circuit Board, PCB, power combining (or dividing) may be avoided, thereby achieving less loss. Nevertheless, differential output may be difficult to achieve especially if more power is required from the fully differential power amplifier.

Considering power amplifier designs, power is typically combined on-chip and the output is single-ended. However, power combining introduces losses. Another solution is to use a differential design, with a differential output, to drive a differential antenna, such as, for example, a dipole antenna. Such a solution may be used to avoid on-chip (or off-chip) power combining by combining power within the antenna, which reduces losses. Nevertheless, it is challenging, if not even impossible, to achieve a fully differential output with such a solution, especially if more power is required from the power amplifier.

Embodiments of the present invention therefore provide a power amplifier with a balanced output, i.e., a balanced feed to an antenna. Said balanced output may be exploited to achieve less loss. Moreover, balanced output may be easy to implement compared to other solutions. In general, balanced current flow may refer to a situation, wherein return current flows in common ground.

For example, some embodiments of the present invention may be exploited to improve an output power of millimeter-wave transmitters by using a balanced Monolithic Microwave Integrated Circuit, MIMIC, a power amplifier and a planar antenna power combiner. Consequently, less loss may be achieved compared to a single-ended power amplifier and a patch, or a dipole antenna, configuration. Also, in accordance with at least some embodiments of the present invention, less loss compared to a fully differential power amplifier and antenna configuration may be achieved.

Figure 2:
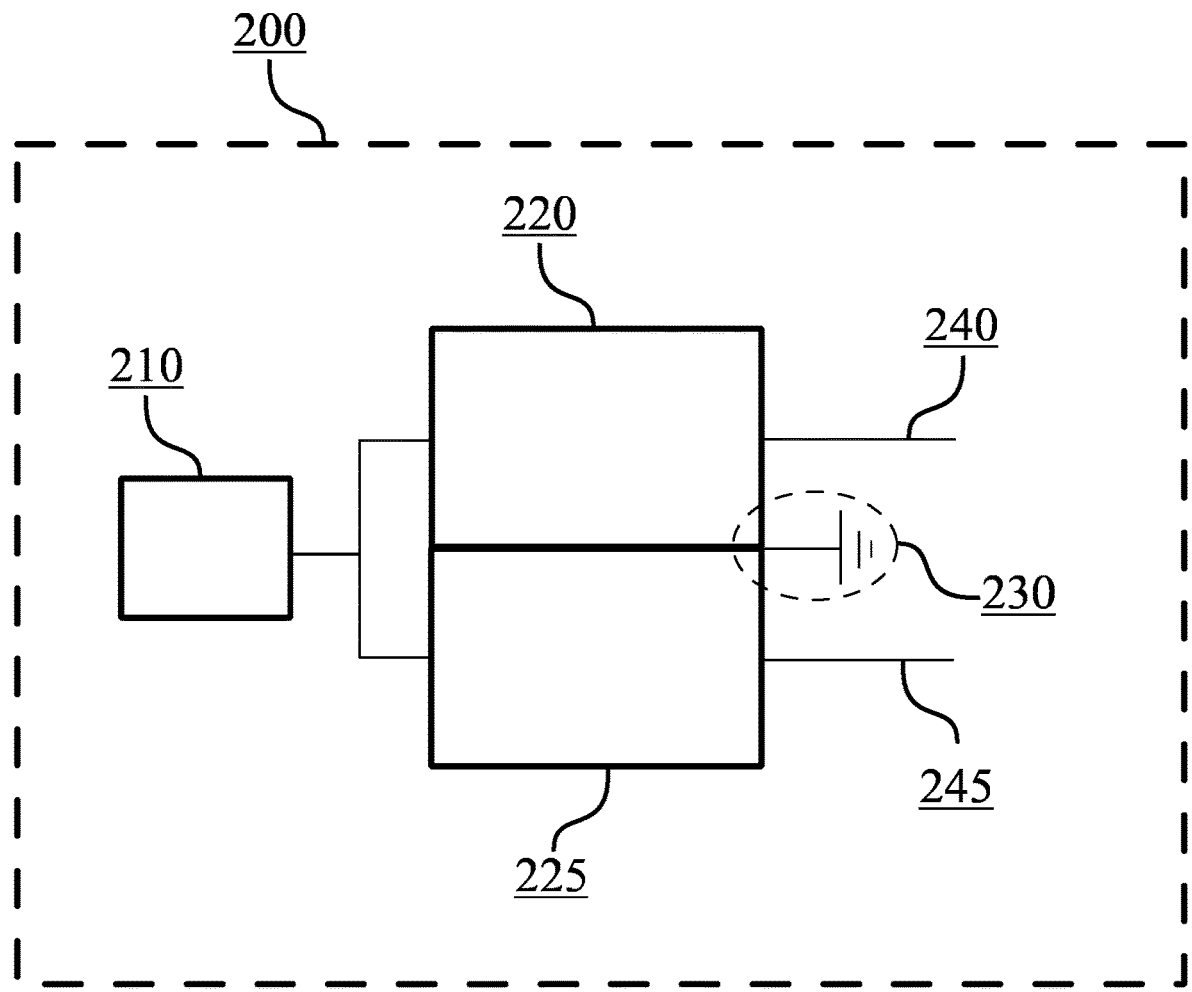
FIG. 2 illustrates an exemplary apparatus in accordance with at least some embodiments of the present invention.

FIG. 2 illustrates an exemplary apparatus in accordance with at least some embodiments of the present invention. The apparatus 200 may be a power amplifier for an antenna, e.g., for a balanced dipole antenna. In some embodiments, an antenna may comprise the apparatus. Moreover, in some embodiments, a wireless terminal, a wireless network node or a relay node may comprise the apparatus 200, and possibly the antenna as well.

The apparatus 200 of FIG. 2 may comprise a Radio Frequency, RF, input 210, a first power amplifier 220 coupled to the RF input 210 and a second power amplifier 225 coupled to the RF input 210. Moreover, in the apparatus 200, a common ground 230 may be coupled to the first power amplifier 220 and the common ground 230 may also be coupled to the second power amplifier 225.

As shown in FIG. 2, the apparatus 200 may also comprise a RF output 240 of the first power amplifier 220 and a RF output 245 of the second power amplifier 225. In some embodiments, the RF outputs 240 and 245 may be coupled to the common ground 230. Thus, return current may flow in the common ground 230 in accordance with at least some embodiments. Alternatively, or in addition, the RF output 240 the first power amplifier 220 may be shifted 180 degrees compared to the RF output 245 of the second power amplifier 225. In some embodiments, the shifting may take place at an input of the first power amplifier 220 or at an input of the second power amplifier 225.

In some embodiments, the RF output 240 of the first power amplifier 220 and the RF output 245 of the second power amplifier 225 may form a balanced feed for an antenna. That is to say, the RF output 240 of the first power amplifier 220 and the RF output 245 of the second power amplifier 225 may be combined and fed to an antenna. The exemplary power amplifier may be coupled to the antenna via the RF output 240 of the first power amplifier 220 and the RF output 245 of the second power amplifier 225. In some embodiments, the antenna may be a balanced dipole antenna, a patch antenna or a multi-layer planar antenna.

In some embodiments, the first power amplifier 220 and the second power amplifier 225 may be two-way power amplifiers. Alternatively, or in addition, the first power amplifier and the second power amplifier may be integrated in a MMIC.

Figure 3:
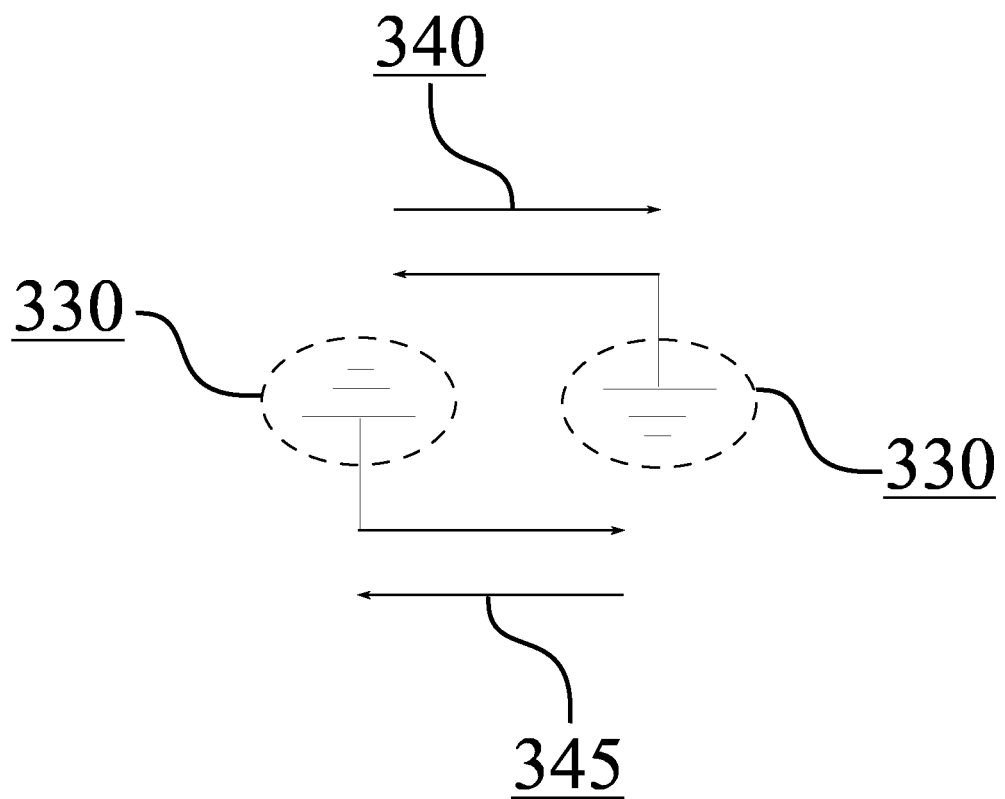
FIG. 3 illustrates a balanced current flow in accordance with at least some embodiments of the present invention.

FIG. 3 illustrates a balanced current flow in accordance with at least some embodiments of the present invention. In FIG. 3, a common ground is denoted by 330. The common ground 330 may correspond to the common ground 230 of FIG. 2. Also, in FIG. 3 a feeding current flow is denoted by 340 and a return current flow is denoted by 345.

In some embodiments, the apparatus 200 may be utilized for generating a balanced feed, e.g., for a multilayer planar antenna. For instance, in case of a balanced patch, different sides of the balanced patch may be excited using two apertures in the common ground plane 230, 330. Moreover, there may be a phase difference of 180 degrees between excitations, i.e., the apertures, and the common ground plane 230, 330 between the excitations, thereby creating the balanced feed for an antenna. Alternatively, said balanced feed may be integrated to a dipole antenna. For example, whole E-band (71-86 GHz) may be covered with a balanced dipole antenna.

A balanced feed may be a supplementary feed mechanism to a single feed. When comparing the balanced feed to a single feed, the balanced feed enables smaller coupling apertures in the common ground. Consequently, back-radiation may be reduced. In general, the common ground may refer to a common ground plane in accordance with embodiments of the present invention.

It is to be understood that the embodiments of the invention disclosed are not limited to the particular structures, process steps, or materials disclosed herein, but are extended to equivalents thereof as would be recognized by those ordinarily skilled in the relevant arts. It should also be understood that terminology employed herein is used for the purpose of describing particular embodiments only and is not intended to be limiting.

Reference throughout this specification to one embodiment or an embodiment means that a particular feature, structure, or characteristic described in connection with the embodiment is included in at least one embodiment of the present invention. Thus, appearances of the phrases "in one embodiment" or "in an embodiment" in various places throughout this specification are not necessarily all referring to the same embodiment. Where reference is made to a numerical value using a term such as, for example, about or substantially, the exact numerical value is also disclosed.

As used herein, a plurality of items, structural elements, compositional elements, and/or materials may be presented in a common list for convenience. However, these lists should be construed as though each member of the list is individually identified as a separate and unique member. Thus, no individual member of such list should be construed as a de facto equivalent of any other member of the same list solely based on their presentation in a common group without indications to the contrary. In addition, various embodiments and example of the present invention may be referred to herein along with alternatives for the various components thereof. It is understood that such embodiments, examples, and alternatives are not to be construed as de facto equivalents of one another, but are to be considered as separate and autonomous representations of the present invention.

Furthermore, the described features, structures, or characteristics may be combined in any suitable manner in one or more embodiments. In the preceding description, numerous specific details are provided, such as examples of lengths, widths, shapes, etc., to provide a thorough understanding of embodiments of the invention. One skilled in the relevant art will recognize, however, that the invention can be practiced without one or more of the specific details, or with other methods, components, materials, etc. In other instances, well-known structures, materials, or operations are not shown or described in detail to avoid obscuring aspects of the invention.

While the forgoing examples are illustrative of the principles of the present invention in one or more particular applications, it will be apparent to those of ordinary skill in the art that numerous modifications in form, usage and details of implementation can be made without the exercise of inventive faculty, and without departing from the principles and concepts of the invention. Accordingly, it is not intended that the invention be limited, except as by the claims set forth below.

The verbs "to comprise" and "to include" are used in this document as open limitations that neither exclude nor require the existence of also un-recited features. The features recited in depending claims are mutually freely combinable unless otherwise explicitly stated. Furthermore, it is to be understood that the use of "a" or "an", that is, a singular form, throughout this document does not exclude a plurality.

In an exemplary embodiment, an apparatus, such as a power amplifier, may include means for carrying out embodiments described above and any combination thereof.

INDUSTRIAL APPLICABILITY

At least some embodiments of the present invention find industrial application in wireless communication systems. Examples of wireless communication networks comprise 5G/NR and WLAN networks. For example, an apparatus in accordance with at least some embodiments of the present invention suits particularly well for wireless communication networks operating at millimetre-wave frequencies.

ACRONYMS LIST

3GPP 3rd Generation Partnership Project
5G 5$^{th}$ Generation
LTE Long Term Evolution
MMIC Monolithic Microwave Integrated Circuit
NR New Radio
PCB Printed Circuit Board
RF Radio Frequency
UE User Equipment
WLAN Wireless Local Area Network

| REFERENCE SIGNS LIST | |
| --- | --- |
| 110, 210 | RF input |
| 120 | Fully differential current flow |
| 130 | Dipole antenna |
| 200 | An exemplary apparatus |
| 220 | First power amplifier |
| 225 | Second power amplifier |
| 230, 330 | Common ground for a first and a second power amplifier |
| 240 | RF output of a first power amplifier |
| 245 | RF output of a second power amplifier |
| 340 | Feeding current flow |
| 345 | Return current flow |

The invention claimed is:

1. An apparatus for an antenna, comprising:
a first power amplifier and a second power amplifier; and
a common ground between the first power amplifier and the second power amplifier, wherein a Radio Frequency, RF, output of the first power amplifier is coupled to the common ground and an RF output of the second power amplifier is coupled to the common ground, wherein the RF output of the first power amplifier is shifted 180 degrees compared to the RF output of the second power amplifier, and the RF output of the first power amplifier and the RF output of the second power amplifier form a balanced feed for the antenna, and the RF outputs of the first and second power amplifiers are combined and arranged to be fed to the antenna.

2. The apparatus according to claim 1, wherein the first and the second power amplifiers are coupled to the common ground.

3. The apparatus according to claim 1, wherein return current flows in the common ground.

4. The apparatus according to claim 1, wherein the apparatus is coupled to, or comprises, a dipole antenna.

5. The apparatus according to claim 1, wherein the apparatus is coupled to, or comprises, a patch antenna.

6. The apparatus according to claim 1, wherein the apparatus is coupled to, or comprises, a multi-layer planar antenna.

7. The apparatus according to claim 1, wherein the first and the second power amplifiers are two-way power amplifiers.

8. The apparatus according to claim 1, wherein the first and the second power amplifiers are integrated in a Monolithic Microwave Integrated Circuit, MMIC.

9. A wireless network node comprising an apparatus for an antenna, wherein the apparatus for an antenna comprises:
a first power amplifier and a second power amplifier; and
a common ground between the first power amplifier and the second power amplifier, wherein a Radio Frequency, RF, output of the first power amplifier is coupled to the common ground and an RF output of the second power amplifier is coupled to the common ground, wherein the RF output of the first power amplifier is shifted 180 degrees compared to the RF output of the second power amplifier, and the RF output of the first power amplifier and the RF output of the second power amplifier form a balanced feed for the antenna, and the RF outputs of the first and second power amplifiers are combined and arranged to be fed to the antenna.

10. The wireless network node according to claim 9, wherein the wireless network node is a base station configured to operate in accordance with a 3rd Generation Partnership Project, 3GPP, standard.

11. The wireless network node according to claim 10, wherein the 3GPP standard is a 5G standard.

12. A wireless terminal comprising an apparatus for an antenna, wherein the apparatus for an antenna comprises:
   a first power amplifier and a second power amplifier; and
   a common ground between the first power amplifier and the second power amplifier, wherein a Radio Frequency, RF, output of the first power amplifier is coupled to the common ground and an RF output of the second power amplifier is coupled to the common ground, wherein the RF output of the first power amplifier is shifted 180 degrees compared to the RF output of the second power amplifier, and the RF output of the first power amplifier and the RF output of the second power amplifier form a balanced feed for the antenna, and the RF outputs of the first and second power amplifiers are combined and arranged to be fed to the antenna.

13. The apparatus according to claim 2, wherein return current flows in the common ground.

14. The apparatus according to claim 1, wherein the common ground is a common ground plane.

15. The apparatus according to claim 3, wherein the common ground is a common ground plane.

* * * * *